Nov. 23, 1943. J. B. MOORE ET AL Re. 22,394

PRINTING TELEGRAPH SYSTEM

Original Filed May 7, 1936 2 Sheets-Sheet 1

INVENTORS
JOHN B. MOORE &
RICHARD E. MATHES
BY H. S. Grover
ATTORNEY

Nov. 23, 1943. J. B. MOORE ET AL Re. 22,394

PRINTING TELEGRAPH SYSTEM

Original Filed May 7, 1936 2 Sheets-Sheet 2

INVENTORS
JOHN B. MOORE &
RICHARD E. MATHES
BY H. S. Grover
ATTORNEY

Reissued Nov. 23, 1943

Re. 22,394

UNITED STATES PATENT OFFICE 22,394

PRINTING TELEGRAPH SYSTEM

John B. Moore, Brooklyn, N. Y., and Richard E. Mathes, Westfield, N. J., assignors to Radio Corporation of America, a corporation of Delaware Original No. 2,183,147, dated December 12, 1939, Serial No. 78,348, May 7, 1936. Renewed April 19, 1939. Application for reissue August 28, 1942, Serial No. 456,514

23 Claims. (Cl. 178—23)

This invention relates to printing telegraph systems and more particularly to a system in which the circuits are subject to static interference and fading conditions.

Printing telegraph apparatus of the more generally used types employ five time elements for coding the signals representing each character to be printed. If these signals are sent over a radio channel or a carrier wave conductor channel they are very much subject to distortion and fading or to mutilation due to the presence of static impulses. The code signals, therefore, are liable to be received in an unintelligible form.

Accordingly, it is an object of our invention to provide a new method of code signaling for operation of printing telegraph equipment. It is a further object of our invention to provide the means for so actuating a printer in response to code signals that the correct characters will be printed so long as the signals are not mutilated, but that when a signal is mutilated by static or fading, then a misprint will be prevented.

It is a further object of our invention to provide means for causing the printer to produce an error indication if any character signal becomes unduly distorted or mutilated.

In carrying out our invention we propose to utilize a signaling code which in all cases comprises a uniform number of marking impulses. Thus, if fewer or more than the correct number of impulses for character selection is received, the master selector device at the receiver will lock out the printing mechanism and thereby prevent the printing of an incorrect character. In place of the character that would be incorrectly printed we can operate the master selector so as to cause an error indicating type bar to be actuated.

If instead of a five-unit code, we adopt a seven-unit code, taking either three or four of the seven elements at a time as marking pulses, it is possible to obtain thirty-five combinations. By the use of eight time elements, taking four at a time as marking pulses for each combination, there is available a total of seventy combinations. By taking only three at a time of the eight time elements a total of fifty-six combinations is available.

Figure 1:
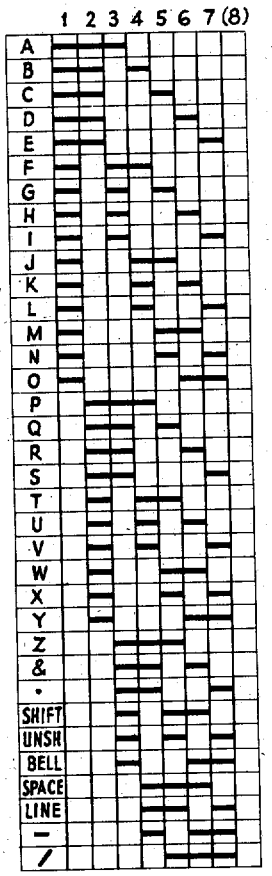
Figure 2:
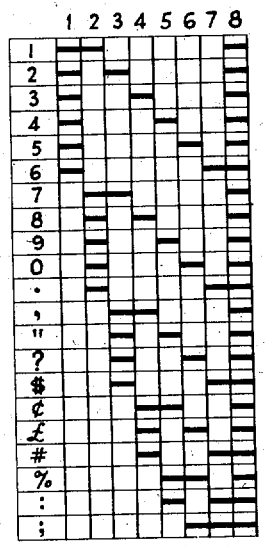

Our invention will be described in more detail upon reference to the accompanying drawings, in which Figures 1 and 2 are code charts showing a specific arrangement of marking and spacing time elements suitable for selecting the type bars of a printing telegraph receiver to be actuated.

Figure 4:
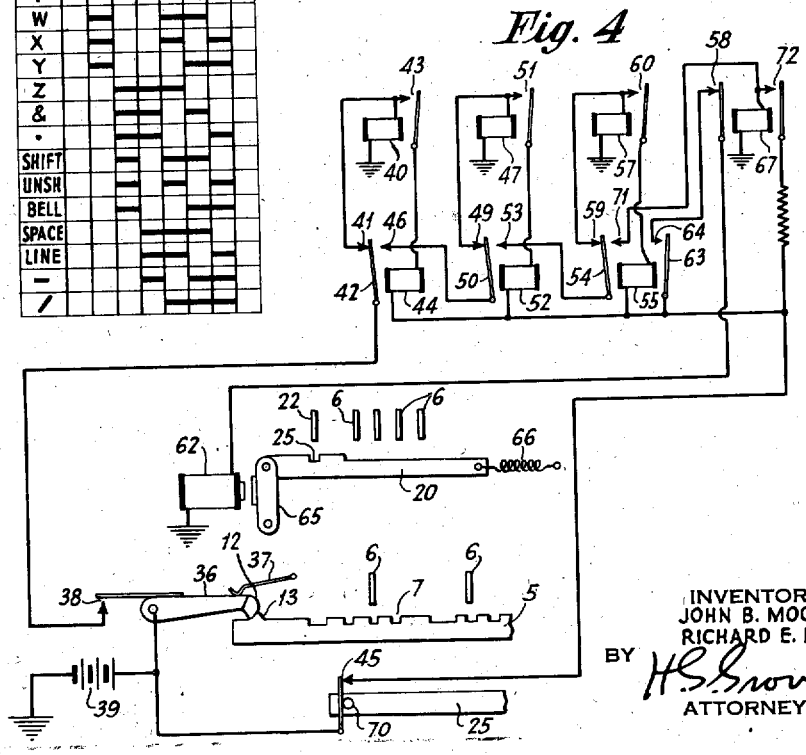
Figure 3:
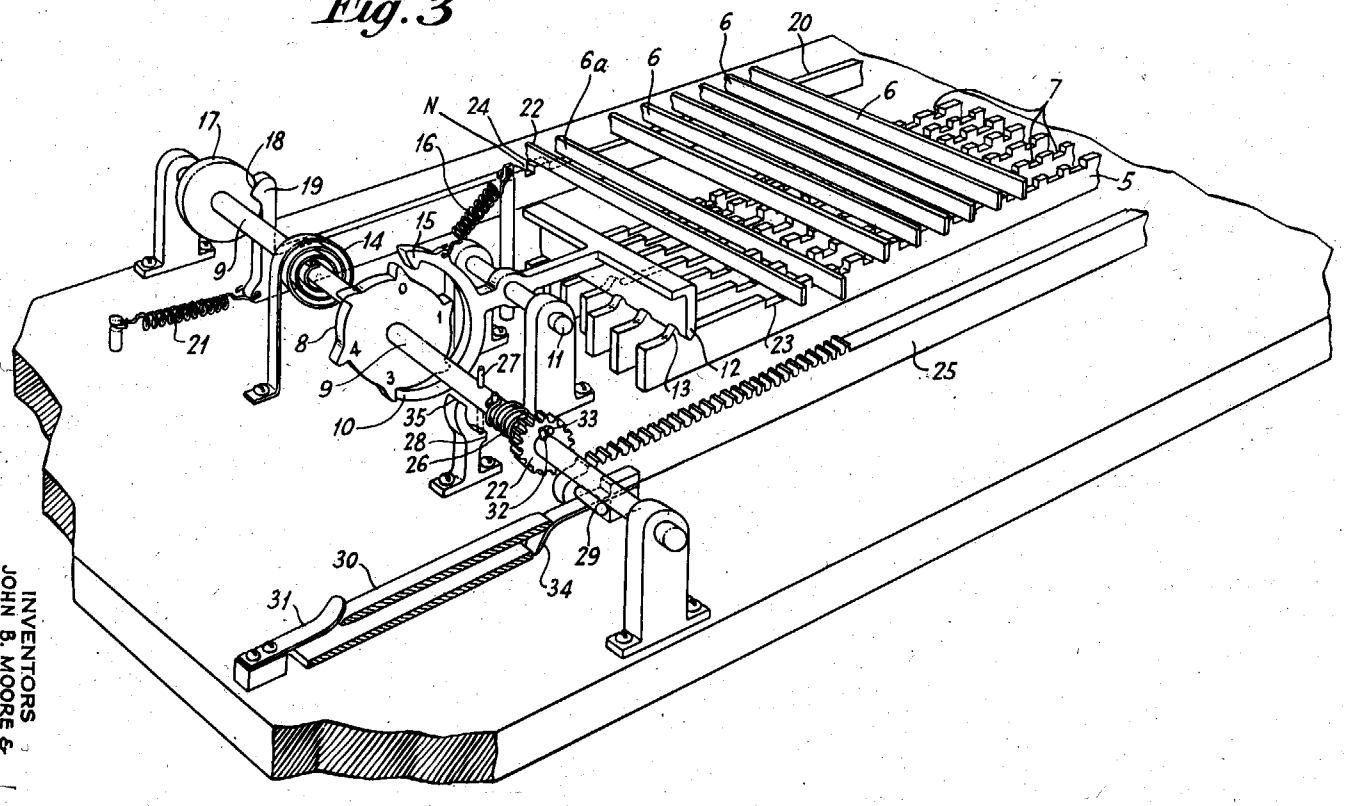

Fig. 3 shows in perspective certain details of a printer including the master selector bars and a few of the type bar selectors of which one is a selector for an error indicating type bar. Means are also shown for causing the printing mechanism to be locked out and the error indicating type bar to be selected when more or less than the proper number of marking impulses is received; and Fig. 4 shows a circuit diagram of a modification of our invention wherein relays are used in place of step-by-step mechanical apparatus for obtaining the selection of the error indicating type bar when needed.

The Baudot code which is in general use in printing telegraph systems is composed of five permutational time elements in any one of which a marking or spacing impulse may be transmitted. The character significance of each code signal is determined by the order of sequence of the marking and spacing impulses. In synchronous systems a continuous succession of five-unit code signals is transmitted. In the so-called "start-stop" systems, however, a spacing impulse of fixed duration is utilized to start the printer in operation for selecting each transmitted character to be printed. This spacing impulse is immediately followed by the five-unit code signal and then comes a "stop-impulse" of indefinite duration to arrest the printer operation until another type key on the keyboard is depressed. In the description to follow it will be understood that the marking and spacing impulses required for character selection are the only ones to be herein considered since the use of additional impulses for operation of a printer by the "start-stop" method is optional and our invention may be applied to a start-stop system as well as to a synchronous system. There are thirty-two possible combinations of marking and spacing impulses in the five-unit code arrangement. That code makes maximum use of the circuit time and of the frequency band of a radio communications channel. It is, however, only suitable for use on a circuit which is free from interference. Fading or noise of any kind results in errors in the received copy. Its use on radio circuits is, therefore, relatively limited. Another disadvantage of the five-unit code is that the number of combinations available is not sufficient to print all of the characters desired including letters, figures, punctuation marks, etc. Accordingly, it is the practice to employ a shift mechanism. It can easily happen that static impulses will produce such a code signal as to improperly actuate the shift mechanism at the receiving end when the transmitting machine is still unshifted. The intelligence thus becomes garbled even without the knowledge of the transmitting operator.

The arrangement of marking and spacing impulses as shown in Fig. 1 may be considered from the standpoint that it is suitable either for a seven-unit code or for a portion of an eight-unit code. For a seven-unit code the marking and spacing units may be according to the showing in the first seven columns. For an eight-unit code, the marking and spacing units may be as designated in the eight columns of both Fig. 1 and Fig. 2. In this case it would usually be unnecessary to employ any code signals for shift and unshift as shown in Fig. 1.

It will be noted that in the embodiment of our invention suggested by Figs. 1 and 2 every signal is composed of three marking impulses but these marking impulses are differently arranged with spacing impulses interspersed. It is equally possible that four marking impulses might be used with the remaining portion of each equal length code signal filled in by spacing impulses. It is also equally possible that a signalling code might be adopted in which each signal is composed of four marking and four spacing impulses arranged in different combinations.

Referring now to Fig. 3, we show one embodiment of the receiving apparatus which is suitable for use with code systems having a fixed number of marking units in each character signal. Only those portions of a printing telegraph instrument are shown which relate to the invention.

The master selector includes the conventional code selector bars 5 over which are the type character selector bars 6. During the reception of a code signal any three of the bars 5 may be moved longitudinally to the left so as to bring into alignment certain notches 7 into which a selected cross bar 6 may drop. Only when the proper number of impulses is received during the time taken up by a seven-unit code signal will a type bar selector 6 be permitted to drop into these aligned notches. If more or fewer than three impulses are received, the cross bars 6 will, all of them, be held up by the raised portions of the selector bars 5.

In order to actuate an error indicating type bar, we have provided a counting device to be controlled by the successive actuations of the master selector code bars 5. This counting device includes an escapement wheel 8 mounted on a shaft 9 and permitted to rotate step-by-step when released by the escapement pawl mechanism 10 which is pivoted on the rock-shaft 11 and is caused to oscillate by virtue of a cross bar 12 which engages with raised teeth 13 on the code selector bars 5.

A coiled spring 14 tends to unwind and to rotate the escapement wheel 8 in a counter-clockwise direction with each release of one of its teeth from engagement with the escapement pawl 10. The escapement wheel is prevented from over-riding successive steps by the downward movement of the pawl member 15 into the gaps between the escapement wheel teeth. After each movement of one of the code selector bars 5 the escapement pawls 10 and 15 are returned to their normal position under the tension of the spring 16.

The various parts illustrated in Fig. 3 have been shown in the position which they would occupy after three of the code bars 5 have been actuated for selecting a character to be typed. The escapement wheel 8 has, therefore, rotated three steps from its initial position. It must be understood, however, that these three steps will be taken regardless of which particular code bars 5 are actuated, although in the illustration it is shown that the first three of these code bars viewed from the front of the device have been actuated. During the rotation of the escapement wheel 8 a cam 17 has been rotated through a like arc so that a notch 18 in the face of this cam has come into alignment with a rider member 19 mounted on the end of the error indicating selector bar 20. This bar 20 has accordingly been pulled slightly to the left under the traction of the spring 21. In this position the selector bar 22 corresponding with the error indicating type bar has been restrained from dropping into the guide notches 23 of the code selector bars 5 by virtue of a raised portion 24 adjacent the notch N on the error selecting bar 20. In the code bars 5 the notches 23 are purposely made wider than some of the other notches in these bars in order that the selection of the cross bar 22 may be effected solely in response to the actuation of the error bar 20.

One of the type bar selectors 6a has been shown in the figure as having been lowered into the notches of the code bars 5 where these notches were brought into alignment by the actuation of the first three of these bars and by not actuating the remaining four bars. If one of these four remaining bars had been actuated the escapement wheel would have taken a fourth step. None of the type bars for the printing of intelligence could be actuated in this case but in order to distinguish between the omission of a character due to a faulty signal and a normal space between words, the error indicating type bar is preferably actuated by the mechanism shown. This actuation can take place either in response to a deficiency or an excess in the number of marking impulses in the code. Assume, for example, that the number of impulses was only two instead of three. In this case the notch 18 in the cam 17 would not be in alignment with the rider member 19 and, therefore, the notch N would be exactly under the bar 22 permitting it to be lowered the same as for the selection of any normal printing character.

In order to restore the escapement wheel 8 to its normal position upon completion of any printing operation, we preferably provide a rack and pinion mechanism connected in any suitable manner with the driving mechanism for the printer. The rack bar 25 has been shown in the drawings as in its normal position, ready to make a restoring movement. This movement is longitudinal of the bar and during its stroke to the left it engages with the pinion 22 rotating the same clockwise so as to wind up the spring 14. The pinion 22 is loosely mounted upon the shaft 9 in order that its rotative movements may always be through the same arc regardless of the number of steps by which the escapement wheel 8 has been released. If an error has been detected by the reception of four or more impulses when three impulses were normal, then the pinion 22 and the shaft 9 will be rotated through a like arc in response to the full stroke of the restoring bar 25. If, however, the escapement wheel 8 has taken fewer than four steps, then while the pinion 22 is rotated through its full arc for a restoring operation, it will first bring the escapement wheel 8 back to its normal initial position, that is, with tooth designated "0" held by the escapement pawl 10, and with the pin 27 resting against a stop 28. Further rotation of the pinion 22 will result in winding up the spiral spring 26 which is stiffer than the spring 14. Upon completion of the stroke of the restoring bar 25 a pin 29 which has ridden over the top of the guide member 30 is now depressed into a channel below this guide member 30 under control of a spring 31. This disengages the rack from the pinion 22 and if the spring 26 is under tension it will immediately unwind so as to reposition the pinion 22 in normal relation to the shaft 9; that is, with the two stop pins 32 and 33 pressing one against the other. The pin 32 is mounted on the shaft 9 while the pin 33 is mounted on the pinion 22. The normal engagement of these pins one with the other is maintained under tension of the spring 26.

Upon completing the return stroke of the restoring bar 25, the pin 29 mounted thereon is lifted out of the channel beneath the guide member 30 by virtue of a resilient spring 34. This actuation of the restoring bar 25 will be understood to take place coincidently with the printing of a character. The mechanism for character printing and for actuation of the restoring bar 25 has not been shown because it is well within the skill of a mechanic to provide suitable connections for carrying out the function of the restoring bar 25.

If the code signal should be mutilated by the occurrence of one or more static impulses so that at least four impulses are received during the transmission of a code signal, then further operations of the escapement member 10–15 will have no effect in releasing the escapement wheel 8 because after four steps the shaft 9 will be arrested from further rotation due to the engagement of its pin 27 with the abutment member 35. The number of teeth in the rack bar 25 is, therefore, limited to what are necessary for rotating the pinion 22, the shaft 9 and the escapement wheel 8 through the arc subtended by four teeth on the escapement wheel.

In certain instances it may be found preferable to employ a counting mechanism which comprises a system of relays as a substitute for the escapement wheel and escapement pawl mechanism shown in Fig. 3. Reference will, therefore, be now made to Fig. 4 in which such an electrical relay system has been shown diagrammatically.

In Figs. 3 and 4 corresponding parts, or parts possessing substantially the same functions, have been given like reference characters. In Fig. 4, for example, the code selector bars 5 have been similarly shown with teeth 13 and with notches 7 for selecting the type selecting cross bars 6. In this case, however, instead of actuating escapement pawls like those, 10, 15, shown in Fig. 3, the teeth 13 are caused to lift a lever 36 against the pressure of a spring 37. This action takes place with each successive movement of the code bars 5. Contact is thereby made between the contact springs 38 so as to momentarily close a circuit from a source of potential 39 through different relays which are actuated in succession. Commencing with the first stroke of a code bar 5, an impulse is initiated from the source 39 through the contacts 38, through armature 42 and back contact 41 of relay 44, and thence through relay 40 to ground. The closing of contacts 43 on the relay 40 prepares a circuit which may be traced from the battery 39 through circuit breaking contacts 45, relay 44, contacts 43, relay 40, and thence to ground. Current flows through this circuit immediately upon the opening of contacts 38, but not before, because during the operation of impulsing, which takes place when the lever 36 rides over a tooth 13, both terminals of the relay 44 are at the same potential. When relay 44 is energized the contacts 43 cause relay 40 to be locked up. Also the armature 42 of relay 44 is pulled away from the back contact 41 and into engagement with the front contact 46. This prepares relay 47 for actuation in response to the second impulse. The second impulse may, therefore, be traced from battery 39, through contacts 38, armature 42, contact 46, armature 50, contact 49, relay 47 and thence to ground. Upon the completion of this impulse and the opening of contacts 38, relay 47 locks up due to the closing of its contacts 51 and the establishment of a locking circuit from battery 39 through contacts 45 and relay 52. Upon the pulling up of the armature 50, a circuit is now prepared through the front contact 53 and thence to the armature 54 of relay 55. The third impulse initiated at contacts 38 may then be further traced through back contact 59 of relay 55 and relay 57 to ground. When relay 55 is actuated in response to the opening of the contacts 38 and the closing of the locking contacts 60 a circuit is established from battery 39 through circuit breaking contacts 45 and the serially connected relays 55 and 57.

Relay 55 has two armatures 54 and 63 both of which are pulled up simultaneously upon the breaking of the impulsing circuit at the contacts 38. Armature 54 upon contacting with the front contact 71 prepares a circuit for a possible fourth or any subsequent impulse through relay 67. Armature 63 upon contacting with its front contact 64 feeds current from the battery 39 through circuit breaking contacts 45, contacts 64 and 58 and thence through a magnet 62 to ground. The function of magnet 62 is to pull up its armature lever 65 to which is connected the error bar 20. In the embodiment of our invention shown in Fig. 4, the error bar 20 is normally held in position for selecting the type bar 22 having an error indicating character thereon. It is only when a character selection consists of three marking impulses, no more and no less, that the magnet 62 is actuated. The notch 25 is at that time withdrawn from beneath the bar 22 and prevents its selection. Any one of the type bars 6 may, however, be selected according to the code combination set up in the code bars 5.

Assuming now that a fourth code bar were to be actuated by a static impulse so as to mutilate the code signal, then the impulse produced at the fourth time of closing the contacts 38 will be directed through the armature 42, front contact 46, armature 50, front contact 53, armature 54, front contact 71 and thence to the relay 67 which is grounded. This relay immediately locks up through the closing of contacts 72 and simultaneously it breaks connection between the contacts 58 which are disposed in the energizing circuit for the magnet 62. Now although all of the relays 40, 44, 47, 52, 57, 55 and 67 are locked up, magnet 62 becomes de-energized and permits of the selection of the error indicating type bar 22, the same as when only one or two impulses of the seven-unit code signal had been received.

Simultaneously with the printing of a character the restoring bar 25 is mechanically actuated.

The mechanism for doing this has not been shown because it is well within the scope of an ordinary mechanic to provide it. The circuit breaking contacts 45 are, therefore, opened for the purpose of unlocking all of the relays which had been successively actuated during the counting operation. The relay system is thus prepared for counting the impulses of a succeeding code signal.

We claim:

1. In a printing telegraph system, means responsive to character representing signals all of which signals are of equal length and possess a fixed ratio other than one-to-one between the number of marking and spacing units thereof, means to de-code said signals, and actuating mechanism responsive to the operation of said de-coding means to print a designated character only when a signal is received the marking and spacing units of which are in conformity with said fixed ratio.

2. In a printing telegraph system a plurality of type bar selectors, means including a plurality of decoding elements cooperative with said selectors for making character selections only when a predetermined invariable number of said elements has been caused to respond to the controlling impulses of a code signal, an error-indicating device, and means controlled solely by the integration of said controlling impulses and operative in response to the reception of an excess or deficiency thereof within the time interval allotted to said code signal for actuating said error-indicating device.

3. A printing telegraph apparatus having a plurality of de-coding members each actuable in response to the reception of a marking element of a code signal, and type selecting elements each selectable only upon the actuation of a fixed normal number of said de-coding members other than one-half the total number thereof.

4. In a printing telegraph system, receiving apparatus having a plurality of decoding members each actuable in response to the reception of a marking element of a code signal, type selecting elements each selectable only upon the actuation of a fixed normal number of said decoding members, means including an additional type selecting element for indicating the reception of a mutilated signal and means rendered effective upon receipt of an abnormal number of marking impulses within a fixed time interval allotted to a code signal for then actuating said additional type-selecting element to cause an error-designating character to be printed in place of such character as would correspond to the signal before mutilation thereof.

5. In a telegraph system, code signal receiving apparatus, a receiving printer having character selecting elements, de-coding means operable in response to signals having a permutational arrangement of marking and spacing units, the number of said marking units being in fixed ratio to the spacing units, for determining the sequence of operation of the character selecting elements, and means operable in sole dependence upon a departure from said fixed ratio for causing said printer to print an error-designating character.

6. A system in accordance with claim 5 and having an impulse counting device mechanically associated with said decoding means and fully controlled thereby for determining instances when mutilated signals are received.

7. A system in accordance with claim 5 and having a relay network operable under the full control of said de-coding means for effecting an error-key selection upon receipt of a mutilated signal.

8. In a device of the class described, printing mechanism operable in response to the receipt of code signals having a uniform number of marking elements and a uniform number of spacing elements, an error-designating key, and means for actuating said key solely in response to the receipt of a signal which lacks conformity with the usual number of marking and spacing elements.

9. A device in accordance with claim 8 and having an escapement mechanism operable step-by-step upon receipt of each marking element of a code signal and means operable by said escapement mechanism to select for actuation the error-designating key when the number of marking impulses received during a time interval allotted to a code signal is either excessive or deficient.

10. A device in accordance with claim 8 and having a relay system operable to count the number of marking elements of a code signal and to make selection of the error key when the number of marking impulses received during the fixed time interval allotted to a code signal is either excessive or deficient.

11. The method of indicating the reception of a mutilated character code signal over a telegraph system by signal elements having selecting and non-selecting functions which comprises allotting an invariable time interval to each code signal, employing a code in which each signal possesses an invariable ratio between the elements having selecting and non-selecting functions, counting the selecting elements in each said time interval and causing an indication to be made when there is an excess or deficiency in said selecting elements.

12. In a telegraph receiving system, recording means responsive to code signals having a uniform number of elements of a certain characteristic plus elements of a different characteristic, an error indicating device, and means responsive to the receipt of a code signal having an abnormal number of elements of said certain characteristic for actuating said error indicating device, said means comprising a first series of impulse-responsive devices and a second series of devices each responsive upon the cessation of an impulse through an associated one of said impulse-responsive devices, and circuits interconnecting the devices of the two series in such manner that they act as impulse counting relays for preventing the operation of said error indicating device upon reception of a correct code signal.

13. In a printing telegraph system, means responsive to character representing signals of equal length, means to decode such of said signals as possess a normally fixed ration between the number of marking and spacing units thereof, actuating mechanism responsive to the operation of said decoding means to print a designated character, and error designating means responsive to the reception of a signal wherein the marking-to-spacing unit ratio is other than the one normally fixed.

14. A printing telegraph apparatus having a plurality of de-coding members each actuable in response to the reception of a marking element of a code signal, type selecting elements each selectable by an appropriate combination of a normally fixed number of said de-coding members, and means effective whenever a received code signal contains an excess or deficiency of marking elements with respect to said normally fixed number for preventing the selection of said type selecting elements.

15. A printing telegraph apparatus having a plurality of de-coding members each actuable in response to the reception of a marking element of a code signal, type selecting elements each selectable by an appropriate combination of a normally fixed number of said de-coding members, an error indicating device, and means effective whenever a received code signal contains an excess or deficiency of marking elements with respect to said normally fixed number for actuating said error indicating device.

16. In a printing telegraph system, a plurality of type bar selectors, means including a plurality of decoding elements cooperative with said selectors for making character selections in response to the reception of any one of a number of different code signals all of which are characterized by an invariable number of controlling units, and means controlled solely by the integration of said controlling units and operative in response to the reception of an excess or deficiency thereof within the time interval allotted to a single code signal for preventing the operation of the first said means.

17. A telegraph receiving system comprising means responsive to character representing signals of equal length, means to decode such of said signals as possess a normally fixed ratio between the number of marking and spacing units thereof, apparatus under control of said decoding means for recording the characters represented by said signals, and a utilization device operable in response to the reception of a signal wherein the marking-to-spacing unit ratio is other than the one normally fixed.

18. In a telegraph receiving system utilizing code signals all of which possess, as transmitted, a fixed total number of marking and spacing elements of uniform length and combined in a fixed ratio, the method of differentiating between such code signals when received, and other combinations of received signal elements, said method comprising counting the effectively received marking elements in each combination, and producing an error designating response to the reception of signal combinations in which the effective marking element count denotes a departure from said fixed ratio.

19. In an electrical system of communication, the method of signal reception which comprises selecting characters to be printed in response to code signals each original composed of a predetermined number of marking elements and a predetermined number of spacing elements, all of said elements being of uniform length, testing the code signals received by counting the number of effective marking elements in each signal to distinguish between true code signals and mutilated code signals, and causing an indication to be made when there is an excess or deficiency in the number of said effective marking element.

20. In radio telegraphy, the method of reception of uniform length code signals the marking and spacing components of which are originally of uniform length and are maintained in a fixed ratio for each character code combination, said method comprising testing the signals received by an integration of the effective marking elements thereof to determine the presence of absence of said fixed ratio, and causing an indication to be made when the absence of said fixed ratio is determined.

21. In a telegraph system, receiving apparatus operative in response to incoming signals composed of groups of marking and spacing elements, said groups being of effectively equal length and containing the same total of elements, each of said groups being coded to designate a separate character, said receiving apparatus including means for counting the effective marking elements in each code combination, and means operative whenever the count indicates a departure from a fixed normal ratio between marking and spacing elements for indicating the reception of a mutilated signal.

22. In a telegraph receiving system, the combination of receiving apparatus comprising printer type selector mechanism, means for translating uniform length code combination signals into actuations of said type selector mechanism thereby to cause the printing of selected characters, means for counting the effectively received marking elements in each character code combination, means for distinguishing between a normally fixed count of such marking elements and departures therefrom such as result from the mutilation of said signals, and means to decode and to utilize such of said signals as possess said normally fixed count when received.

23. In an electrical system of communication, the combination of receiving apparatus comprising means responsive to code combination signals each of which signals is normally composed of a fixed number of marking elements and a fixed number of spacing elements, printing apparatus having character selecting means responsive to the reception of said signals when they are normally composed, means for detecting the reception of signals which, due to mutilation, possess an abnormal ratio between their effective marking and spacing elements, and means for printing an error indicating symbol under control of said detecting means.

RICHARD E. MATHES,
JOHN B. MOORE.